(12) United States Patent
Jung et al.

(10) Patent No.: US 10,792,754 B2
(45) Date of Patent: Oct. 6, 2020

(54) BONDING APPARATUS AND BONDING METHOD THEREOF

(71) Applicant: Samsung Display Co., Ltd., Yongin-si, Gyeonggi-do (KR)

(72) Inventors: Kyung Hwan Jung, Yongin-si (KR); Ju Hwan Kim, Yongin-si (KR); Sang Kyo Shin, Yongin-si (KR); Gye Hwan Lim, Yongin-si (KR); Mun Sik Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 294 days.

(21) Appl. No.: 15/831,191

(22) Filed: Dec. 4, 2017

(65) Prior Publication Data
US 2018/0154477 A1 Jun. 7, 2018

(30) Foreign Application Priority Data
Dec. 6, 2016 (KR) ........................ 10-2016-0165036

(51) Int. Cl.
*B23K 13/02* (2006.01)
*G02F 1/1345* (2006.01)
*H05B 6/44* (2006.01)
*G02F 1/13* (2006.01)
*H05B 6/14* (2006.01)
(Continued)

(52) U.S. Cl.
CPC .............. *B23K 13/02* (2013.01); *B23K 13/01* (2013.01); *G02F 1/1303* (2013.01); *G02F 1/13458* (2013.01); *H05B 6/14* (2013.01); *H05B 6/44* (2013.01); *B23K 2101/36* (2018.08); *G02F 1/1368* (2013.01); *G02F 1/13452* (2013.01); *G02F 1/133305* (2013.01); *H01L 2924/12044* (2013.01); *H05K 1/144* (2013.01); *H05K 3/361* (2013.01); *H05K 2201/10136* (2013.01); *H05K 2203/101* (2013.01)

(58) Field of Classification Search
CPC .... B23K 13/02; B23K 13/01; B23K 2101/36; G02F 1/1303; G02F 1/13458; G02F 1/13452; G02F 1/133305; G02F 1/1368; H05B 6/14; H05B 6/44; H01L 2924/12044; H05K 1/144; H05K 2201/10136; H05K 2203/101
USPC ...... 219/617, 635, 645, 647, 649; 156/273.3
See application file for complete search history.

(56) References Cited

U.S. PATENT DOCUMENTS 5,373,144 A * 12/1994 Thelander ............... B29C 33/06
219/635
7,144,471 B2 * 12/2006 Kobayashi ............. B29C 43/36
156/272.2
(Continued)

FOREIGN PATENT DOCUMENTS

KR 10-1621025 B1 5/2016

*Primary Examiner* — Lien M Ngo
(74) *Attorney, Agent, or Firm* — Lewis Roca Rothgerber Christie LLP

(57) ABSTRACT

A bonding apparatus includes a support member configured to support a first substrate of a display panel and a connecting member, a bonding unit located above the support member and configured to compress the first substrate and the connecting member against each other using a bonding head to which a heating member is attached, and a magnetic-field generating part configured to generate a magnetic field to heat the heating member in an electromagnetic induction method.

12 Claims, 12 Drawing Sheets

(51) Int. Cl.
*B23K 13/01* (2006.01)
*G02F 1/1333* (2006.01)
*H05K 3/36* (2006.01)
*G02F 1/1368* (2006.01)
*H05K 1/14* (2006.01)
*B23K 101/36* (2006.01)

(56) References Cited

U.S. PATENT DOCUMENTS

| | | | |
|---|---|---|---|
| 9,093,549 B2 | 7/2015 | Wasserman et al. | |
| 9,126,393 B2 * | 9/2015 | Lee | B32B 37/10 |
| 9,711,483 B2 * | 7/2017 | Wada | H05K 3/0008 |
| 9,739,300 B2 * | 8/2017 | Yamada | H05K 3/321 |
| 2001/0001464 A1 * | 5/2001 | Godwin | B23K 1/002 |
| | | | 219/603 |
| 2015/0082621 A1 * | 3/2015 | Yamada | G02F 1/1303 |
| | | | 29/740 |

* cited by examiner

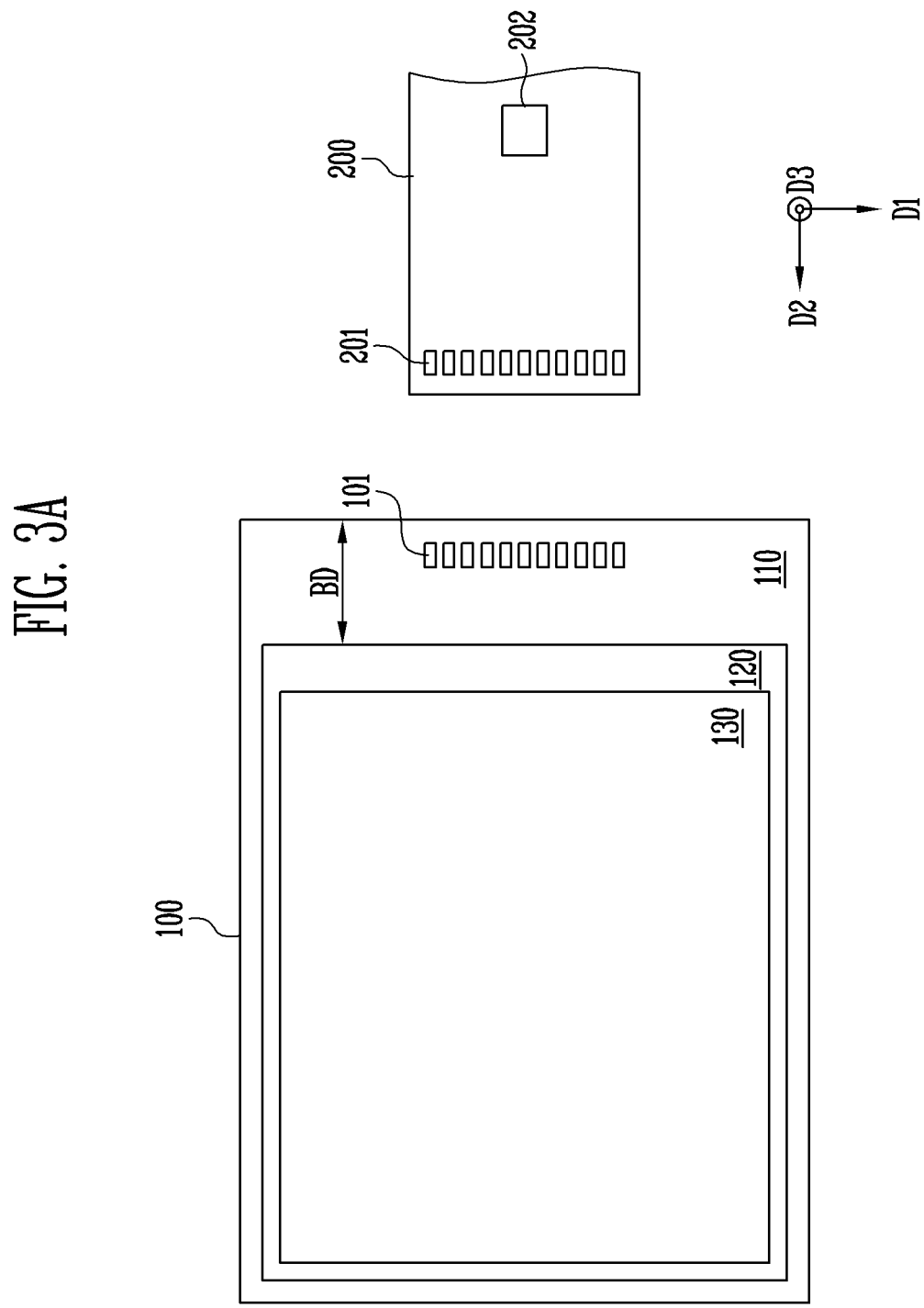

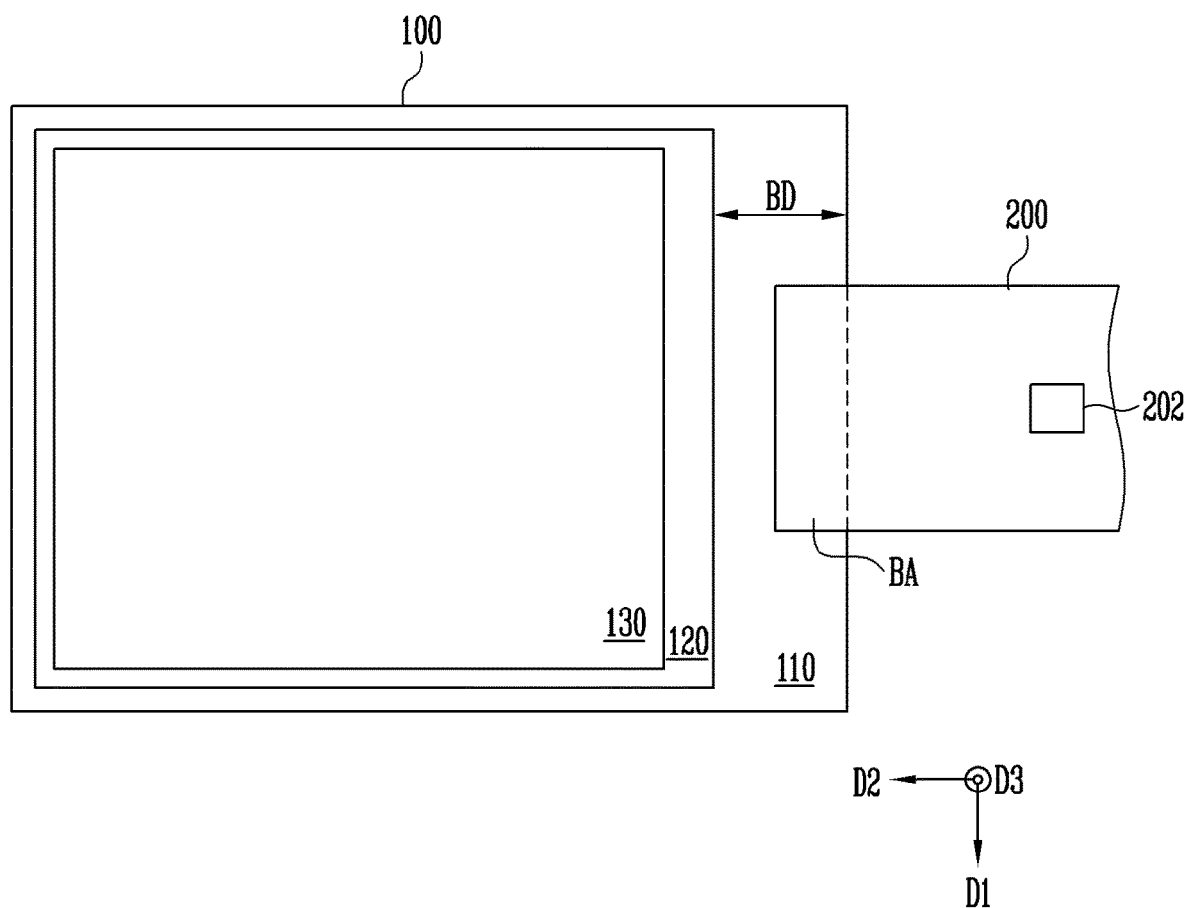

FIG. 7A
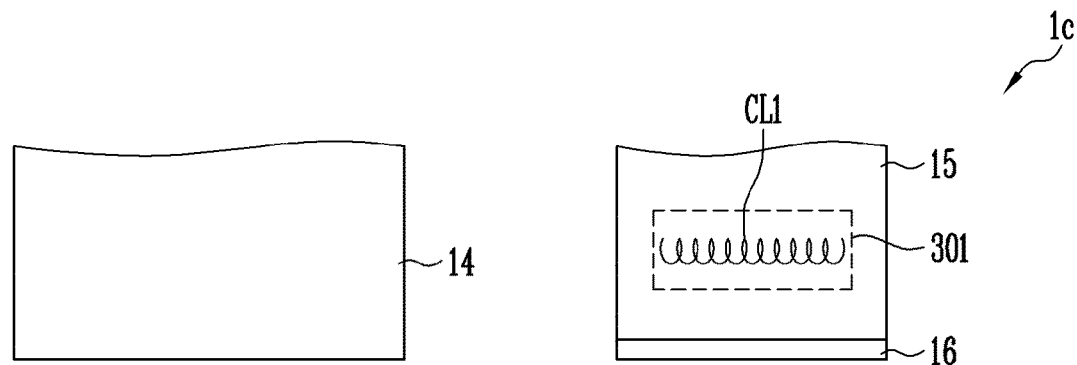
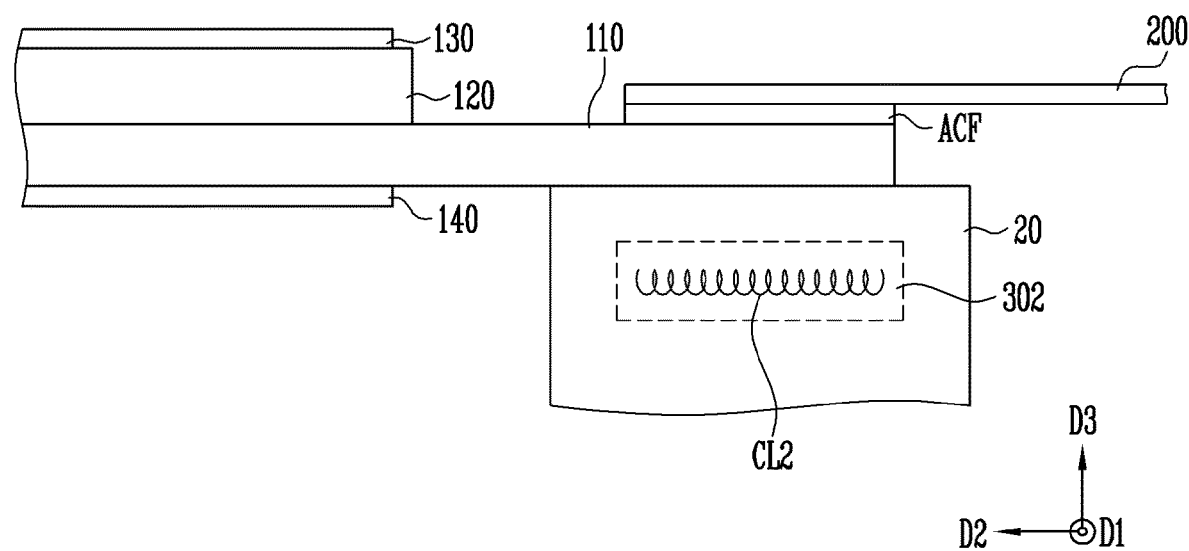

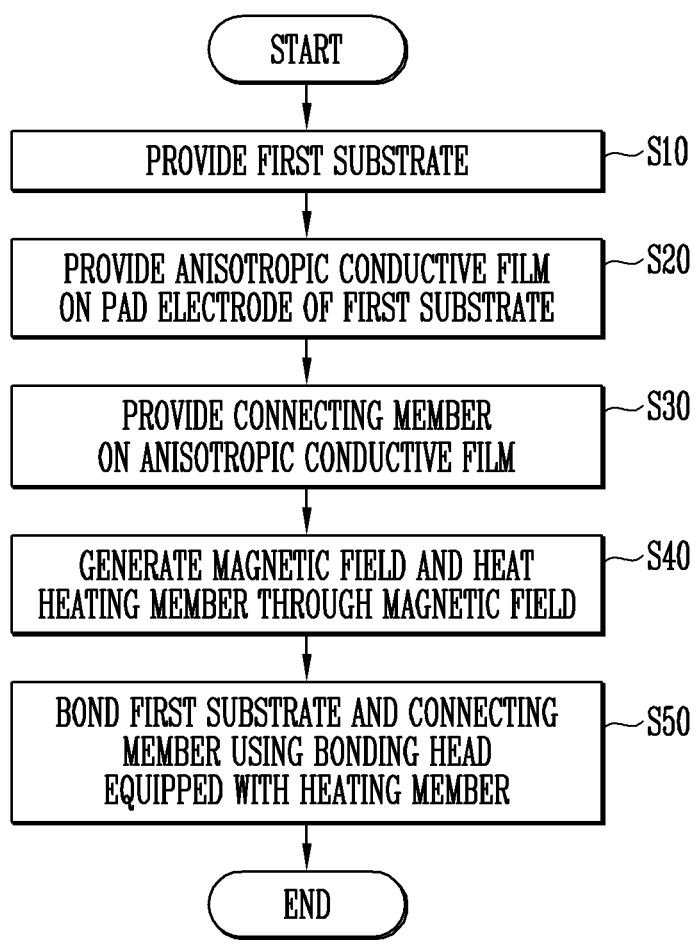

BONDING APPARATUS AND BONDING METHOD THEREOF

CROSS-REFERENCE TO RELATED APPLICATION

This application claims priority to and the benefit of Korean patent application no. 10-2016-0165036 filed on Dec. 6, 2016, the entire content of which is incorporated herein by reference.

BACKGROUND

1. Field

One or more aspects of one or more embodiments of the present disclosure relate to a bonding apparatus and a bonding method thereof.

2. Description of Related Art

A display device may refer to a device that displays an image. Examples of the display device may include a liquid crystal display device (LCD), a plasma display panel device (PDP), a field emission display device (FED), an organic light emitting diode device (OLED), an electrophoretic display device (EPD) and the like.

Recently, research is being actively conducted on a flexible display device capable of maintaining display performance even when it is bent. Such flexible display device may employ a flexible substrate with improved flexibility, and may use plastics or resins as a material of the flexible substrate.

Meanwhile, as an average size (e.g., thickness) of the display device gradually becomes smaller and a bezel of the display device becomes less (e.g., thinner), thermal deformation or thermal fracture of a polarizing layer included in the display panel may occur during a bonding process of the display panel.

SUMMARY

One or more aspects of one or more embodiments of the present disclosure are directed toward a bonding apparatus capable of preventing or reducing thermal deformation or thermal fracture of a polarizing layer included in a display panel when bonding is performed. One or more aspects of one or more embodiments of the present disclosure are directed toward a bonding method of the bonding apparatus.

According to one or more embodiments of the present disclosure, a bonding apparatus includes a support member configured to support a first substrate of a display panel and a connecting member; a bonding unit above the support member, and configured to compress the first substrate and the connecting member against each other using a bonding head to which a heating member is attached; and a magnetic-field generating part configured to generate a magnetic field to heat the heating member by an electromagnetic induction method.

The support member may include the magnetic-field generating part.

The magnetic-field generating part may include a plurality of coils, and may be configured to operate by alternating current power.

The heating member may be configured to transfer heat through a first surface facing the connecting member, and a second surface surrounding a circumference of the first surface.

The heating member may include at least one selected from iron, cast iron, and ferromagnetic stainless steel.

The bonding head may be a heat resistor.

The first substrate may include a plurality of pad electrodes, and the connecting member may include a plurality of terminals. The bonding unit may compress the plurality of pad electrodes of the first substrate and the plurality of terminals of the connecting member against each other.

At least one of the display panel and the connecting member may have flexibility.

A second substrate of the display panel may be formed on the first substrate, and a thickness of the heating member may be smaller than a thickness of the second substrate.

When the bonding unit may compress a top surface of the connecting member, a top surface of the heating member may be lower than a top surface of the second substrate.

According to one or more embodiments of the present disclosure, a bonding apparatus includes a moving unit configured to move a first substrate of a display panel; a support member configured to support the first substrate and a connecting member; a bonding unit above the support member, and configured to compress the first substrate and the connecting member against each other using a bonding head equipped with a heating member; and a first magnetic-field generating part and a second magnetic-field generating part, each configured to generate a magnetic field to heat the heating member by an electromagnetic induction method.

The bonding unit may include the first magnetic-field generating part.

The support member may include the second magnetic-field generating part.

Each of the first magnetic-field generating part and the second magnetic-field generating part may include a plurality of coils, and may be configured to operate by alternating current power.

According to one or more embodiments of the present disclosure, an operating method of a bonding apparatus includes providing an anisotropic conductive film on a pad electrode of a first substrate; providing a connecting member on the anisotropic conductive film; generating a magnetic field, and heating a heating member through the magnetic field; and bonding the first substrate and the connecting member, using a bonding head equipped with the heating member.

BRIEF DESCRIPTION OF THE DRAWINGS

FIGS. 3A and 3B are views illustrating the configuration of a display panel and a connecting member bonded by a bonding apparatus according to an embodiment of the present disclosure.

FIGS. 7A and 7B are sectional views illustrating a bonding method of a bonding apparatus according to an embodiment of the present disclosure.

FIG. 8 is a flowchart illustrating acts of operation of the bonding apparatus according to an embodiment of the present disclosure.

DETAILED DESCRIPTION

Figure 1:
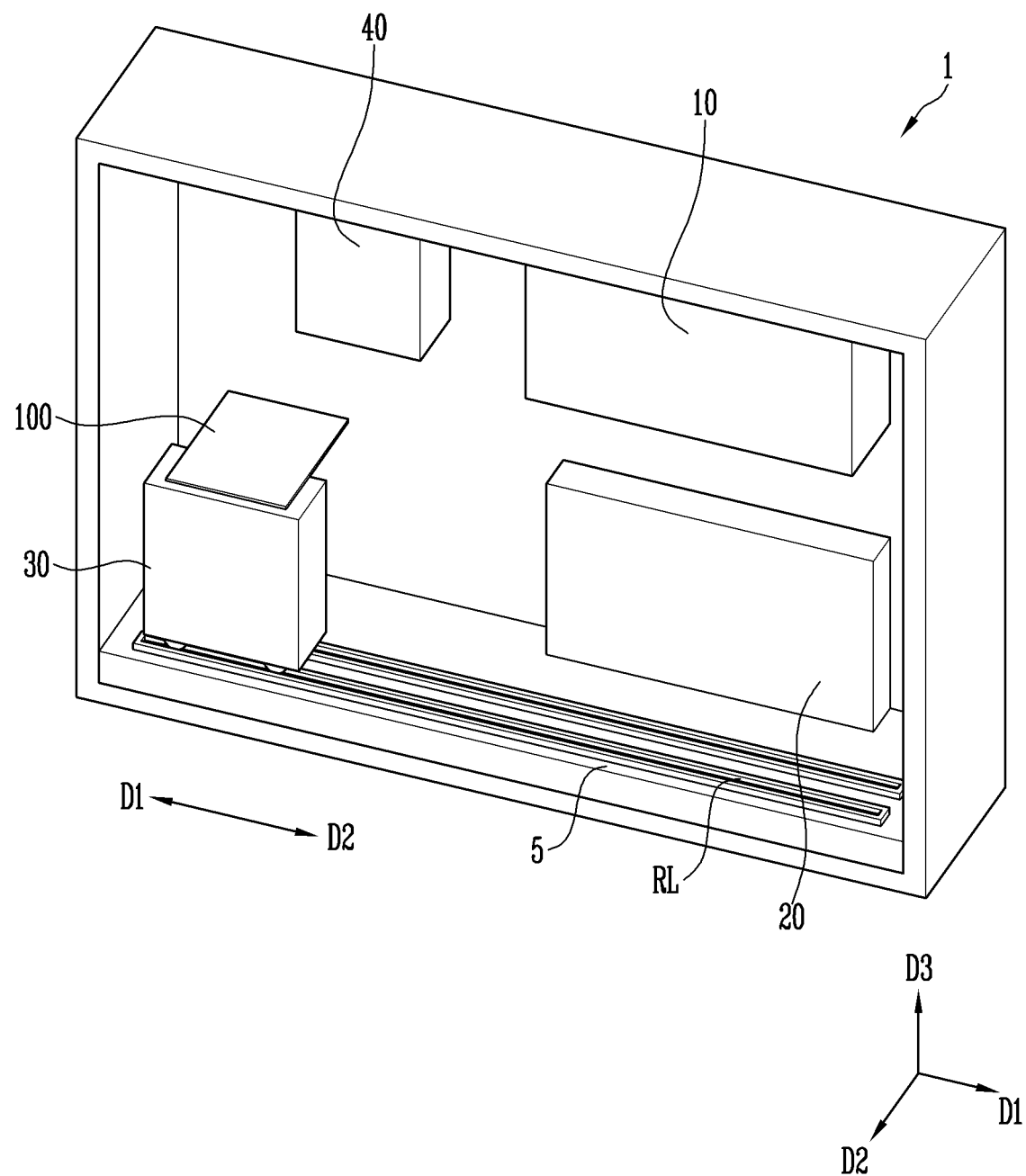
FIG. 1 is a perspective view schematically illustrating a bonding apparatus according to an embodiment of the present disclosure.

The above and other objects and features of the disclosure will be described more fully hereinafter with reference to the accompanying drawings, in which example embodiments of the invention are shown. While a preferred embodiment of the invention has been described using specific terms, such description is for illustrative purposes only, and it should be understood that changes, equivalences and substitutions may be made without departing from the spirit or scope of the following claims and their equivalents.

Unless otherwise defined, all terms including technical and scientific terms used herein have the same meaning as that which is commonly understood by one of ordinary skill in the art to which the present invention belongs. It will be further understood that terms defined in commonly used dictionaries should be interpreted as having a meaning that is consistent with their meaning in the context of the relevant art and will not be interpreted in an idealized or overly formal sense unless expressly so defined herein.

Terms such as "first" and "second" may be used to describe various components, but they should not limit the various components. Those terms are only used for the purpose of differentiating a given component from other components.

The terms "include/comprise" or "including/comprising" used in the specification may indicate that one or more components, steps, operations, and/or elements exist or are added, but do not preclude the presence or addition of one or more other components, steps, operations, and/or elements.

In the drawings, lengths and sizes of layers and regions may be exaggerated for clarity. Like reference numerals in the drawings denote like elements. It is also noted that in this specification, the expression, a layer is located "on" another layer, may refer to a layer not only formed "directly on" another layer but also a layer formed above another layer with one or more intermediate layers or elements therebetween. Furthermore, although in the drawings a layer surface may be shown as substantially flat, the layer surface is not necessarily flat, for example, a step may be formed in a surface of an upper layer due to the surface shape of a lower layer during a lamination process.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

Hereinafter, embodiments will be described in greater detail with reference to the accompanying drawings. Furthermore, components that are not necessary for understanding of the present disclosure will not be included in the drawings, for clarity.

Hereinafter, a bonding apparatus and a bonding method thereof according to an embodiment of the present disclosure will be described with reference to the accompanying drawings.

Figure 2:
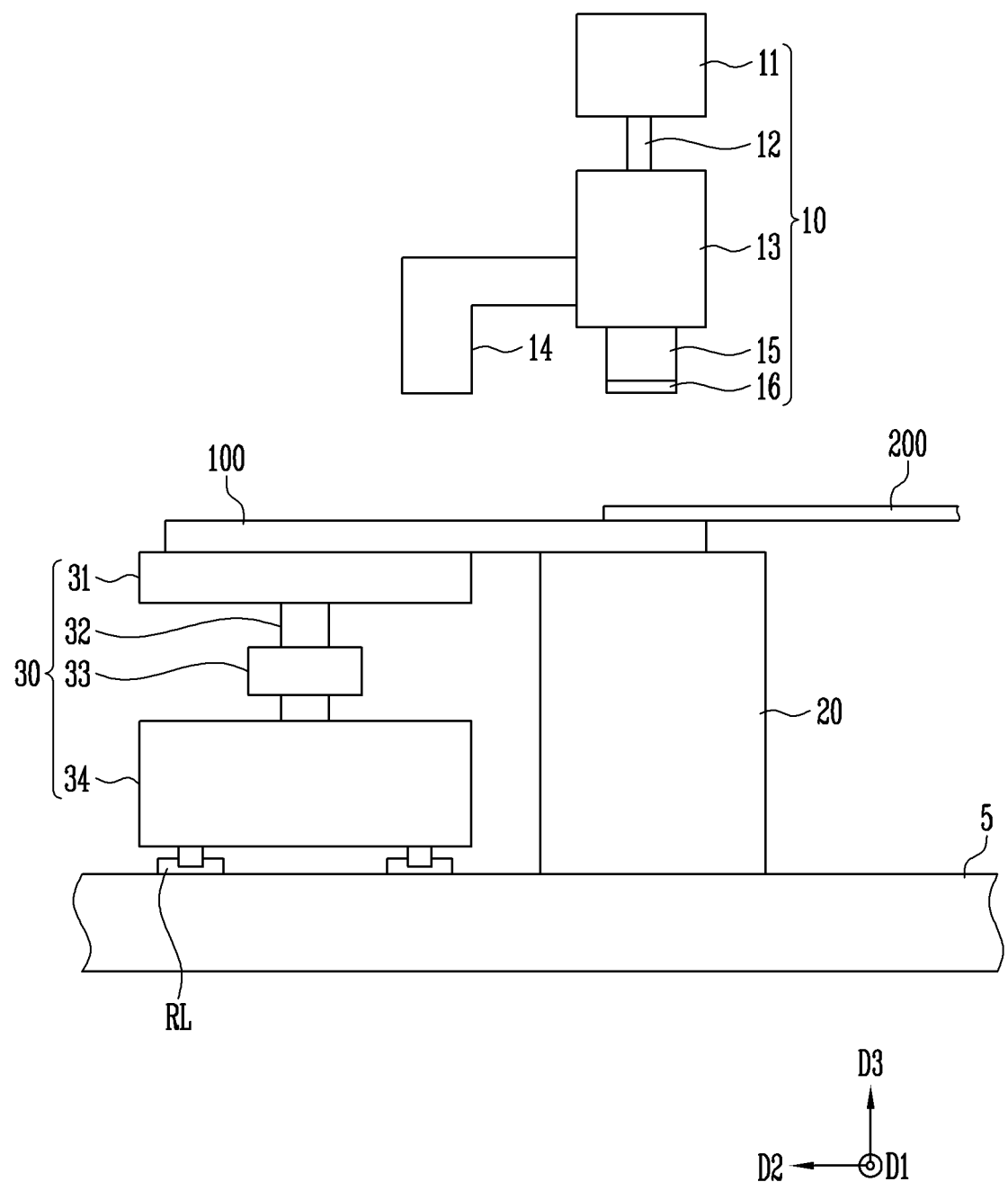
FIG. 2 is a detailed sectional view illustrating the bonding apparatus according to an embodiment of the present disclosure.

FIG. 1 is a perspective view schematically illustrating a bonding apparatus according to an embodiment of the present disclosure. FIG. 2 is a detailed sectional view illustrating the bonding apparatus according to an embodiment of the present disclosure. FIG. 2 illustrates a state (or act) in which a stage 31 moves towards a bonding unit 10 and a support member 20, as a moving unit 30 is being driven.

Referring to FIGS. 1 and 2, the bonding apparatus 1 may be a device for bonding a connecting member 200 to a display panel 100. For example, the connecting member 200 may be included in a flexible printed circuit board (FPCB), a tape carrier package (TCP), and/or a chip on film (COF).

The display panel 100 bonded by the bonding apparatus 1 may be a panel having flexible properties and capable of being bent by external force, such as a plastic panel and/or a thin metal panel. However, the present disclosure is not limited thereto. For example, the bonding apparatus 1 may bond the connecting member 200 to a panel having inflexible properties, such as a glass panel and/or a wafer.

The bonding apparatus 1 may include a workbench 5, the bonding unit 10, the support member 20, the moving unit 30, and an auxiliary member 40.

The workbench 5, the bonding unit 10, the support member 20, the moving unit 30, and the auxiliary member 40 may be accommodated in a housing of the bonding apparatus 1.

The workbench 5 may refer to a support at which the support member 20 and the moving unit 30 are located.

The bonding unit 10 may perform a bonding process. For example, the bonding unit 10 may compress and heat the display panel 100, the connecting member 200, and an anisotropic conductive film interposed therebetween. A more detailed description thereof will be provided with reference to FIGS. 5A to 7B.

As the bonding process of the bonding unit 10 is performed, the display panel 100 and the connecting member 200 may be electrically connected (or coupled) to each other.

Herein, the bonding apparatus 1 including one bonding unit 10 that performs one bonding process will be described by way of example. However, according to an embodiment, the bonding unit 10 may perform a plurality of bonding processes. For example, the bonding unit 10 may perform a subsidiary bonding process and a main bonding process, and the subsidiary bonding process and the main bonding process may be performed under different process conditions. For example, the subsidiary bonding process may be performed at a temperature of about 80° C. to about 120° C., and the main bonding process may be performed at a temperature of about 250° C. to about 300° C.

Furthermore, according to an embodiment, the bonding apparatus 1 may include a subsidiary bonding unit and a main bonding unit. The subsidiary bonding unit and the main bonding unit may perform the subsidiary bonding process and the main bonding process, respectively. In this regard, each of the subsidiary bonding unit and the main bonding unit may have a structure similar to that of the bonding unit 10.

The bonding unit 10 may include a bonding drive part 11, a bonding shaft 12, a bonding frame 13, a press member 14, a bonding head 15, and a heating member 16.

The bonding drive part 11 may be coupled with the bonding shaft 12. The bonding drive part 11 may be rectilinearly driven along a third direction axis D3.

The bonding shaft 12 may be rectilinearly moved along a vertical direction of the workbench 5 (e.g., a direction of the third direction axis D3 and an opposite direction of the third direction axis D3), as the bonding drive part 11 is driven.

The bonding frame 13 may be coupled with the bonding shaft 12, the press member 14 and the bonding head 15.

The bonding frame 13 may be rectilinearly moved along the vertical direction of the workbench 5 (e.g., the direction of the third direction axis D3 and the opposite direction of the third direction axis D3), as the bonding drive part 11 is driven.

Likewise, the press member 14 and the bonding head 15 coupled to the bonding frame 13 may be rectilinearly moved along the vertical direction of the workbench 5 (e.g., the direction of the third direction axis D3 and the opposite direction of the third direction axis D3), as the bonding drive part 11 is driven.

If the bonding frame 13 moves downwards as the bonding drive part 11 is driven, the press member 14 presses the display panel 100 held on the stage 31, so that the display panel 100 may be more stably fixed to the stage 31. Furthermore, the display panel 100 may be kept substantially flat between the press member 14 and the stage 31, thus allowing the bonding unit 10 to more easily perform a bonding process. Furthermore, the above-described arrangement makes it easier to align the display panel 100 with the connecting member 200, so that it is possible to more precisely perform the bonding process.

According to an embodiment, the press member 14 may stably fix the display panel 100 onto the stage 31, using at least one selected from a magnetic material, a metallic material generating attractive force due to magnetic properties, a suction hole and an adhesive. However, the present disclosure is not limited thereto.

The bonding head 15 may move away from or closer to the support member 20, as the bonding drive part 11 is driven. Thus, the bonding head 15 may compress the display panel 100 and the connecting member 200 provided on the support member 20, via the heating member 16. A more detailed description thereof will be provided with reference to FIGS. 5A to 7B.

The bonding head 15 may have heat resistance. For example, the bonding head 15 may be made of a heat-resistant material.

In an embodiment, the bonding head 15 may include magnetic-field generating parts 300 and 301 (see e.g., FIGS. 6A to 7B). A more detailed description thereof will be provided with reference to FIGS. 6A to 7B.

The heating member 16 may be attached to the bonding head 15. The heating member 16 may include at least one component selected from iron, cast iron, and ferromagnetic stainless steel. A more detailed description thereof will be provided with reference to FIGS. 5A to 7B.

The bonding head 15 may compress and heat the display panel 100, the connecting member 200 and the anisotropic conductive film interposed therebetween via the heating member 16, so that conductive particles contained in the anisotropic conductive film are connected (or coupled) to pad electrodes 101 (see FIG. 3A) of the display panel 100 and terminals 201 (see FIG. 3A) of the connecting member 200, thus performing the bonding process. As described above, after the bonding process is performed, the display panel 100 and the connecting member 200 may be electrically connected (or coupled) to each other.

The support member 20 may be fixed onto the workbench 5 of the bonding apparatus 1.

The display panel 100, the connecting member 200 and the anisotropic conductive film interposed therebetween may be provided on the support member 20.

The support member 20 may support the display panel 100, the connecting member 200 and the anisotropic conductive film interposed therebetween. For example, the support member 20 may support a part of the display panel 100, a part of the connecting member 200 and the anisotropic conductive film interposed therebetween. A more detailed description thereof will be provided with reference to FIGS. 5A to 7B.

According to an embodiment, the support member 20 may stably fix the display panel 100 and the connecting member 200 onto the support member 20, using a magnetic material such as stainless steel, a metallic material generating attractive force due to magnetic properties, a suction hole and/or an adhesive. However, the present disclosure is not limited thereto.

According to an embodiment, the support member 20 may include a photographing part. The photographing part may be configured to include a plurality of backlights and a camera. The backlights may generate and radiate light, and the camera may photograph a bonding portion of the display panel 100 and the connecting member 200, using light, to generate image data (a region where the display panel 100 is bonded to the connecting member 200). Therefore, a worker may easily check an alignment between the display panel 100 and the connecting member 200 using the image data.

The support member 20 may include a material having high strength. Thus, the support member 20 may withstand pressure resulting from the movement of the bonding head 15 in the bonding process.

The support member 20 may include magnetic-field generating parts 300 and 302 (see FIGS. 5A, 5B, 7A and 7B). A detailed description thereof will be provided with reference to FIGS. 5A, 5B, 7A and 7B.

The moving unit 30 may move along a transfer rail RL to move the display panel 100.

The moving unit 30 may include a stage 31, a rotating shaft 32, a rotation drive part 33, and a movement drive part 34.

For example, when the display panel 100 is fed from an outside to the moving unit 30, the moving unit 30 may move along the transfer rail RL (along a first direction axis D1), so that the display panel 100 may move from the auxiliary member 40 towards the bonding unit 10 and the support member 20.

The stage 31 may support the display panel 100. For example, the stage 31 may support a part of the display panel 100. According to an embodiment, the stage 31 may stably fix the display panel 100 on the stage 31, using a magnetic material, a metallic material generating attractive force due to magnetic properties, a suction hole and/or an adhesive.

As described above, if the stage 31 and the press member 14 both contain a magnetic material and a metallic material generating attractive force due to magnetic properties, it may be possible to stably fix the display panel 100 using attractive force generated between the stage 31 and the press member 14.

As the movement drive part 34 is driven (e.g., operated), the stage 31 may move rectilinearly along a first direction axis D1. For example, the stage 31 may be spaced apart from the support member 20 so that the stage 31 and the support member 20 do not interfere with each other during the rectilinear movement.

Furthermore, when viewed from a side (e.g., the view illustrated in FIG. 1), an upper surface of the stage 31 and an upper surface of the support member 20 may be at the same height. However, the present disclosure is not limited thereto. According to an embodiment, the upper surface of the support member 20 may be higher than the upper surface of the stage 31, and the height difference between the upper surface of the stage 31 and the upper surface of the support member 20 may be equal to a thickness of a polarizing layer of the display panel 100. A more detailed description of the polarizing layer will be provided with reference to FIGS. 5A to 7B.

One end of the rotating shaft 32 may be coupled to a bottom of the stage 31, while the other end may be coupled to the rotation drive part 33. That is, when the rotation drive part 33 is driven (e.g., operated) and the rotating shaft 32 is thus rotated, the stage 31 may be rotated along with the rotating shaft 32.

Therefore, the position of the pad electrodes 101 (see FIG. 3A) of the display panel 100 may be easily controlled to face the bonding unit 10 and the support member 20, by driving the rotation drive part 33, regardless of a direction in which the display panel 100 is fed to the stage 31.

The movement drive part 34 may be coupled with the rotation drive part 33. The movement drive part 34 may move the stage 31 along the first direction axis D1, using the transfer rail RL.

Therefore, as the movement drive part 34 is driven, the stage 31 may move the display panel 100 from the auxiliary member 40 to the bonding unit 10 and the support member 20.

As the stage 31 moves as described above, each of the bonding unit 10, the support member 20 and the auxiliary member 40 may easily perform a predetermined (or set) process on the display panel 100.

The auxiliary member 40 may provide (e.g., place or position) the anisotropic conductive film on the pad electrodes 101 (see FIG. 3A) of the display panel 100. For example, the auxiliary member 40 may provide the anisotropic conductive film on the pad electrodes 101 (see FIG. 3A) positioned on a side of a first substrate 110 (see FIGS. 3A to 7B) of the display panel 100.

The anisotropic conductive film may refer to an element that electrically connects (or couples) the pad electrodes 101 (see FIG. 3A) of the display panel 100 with the terminals 201 (see FIG. 3A) of the connecting member 200.

The anisotropic conductive film may include an adhesive material and conductive particles contained in the adhesive material. According to an embodiment, the anisotropic conductive film may be attached to the pad electrodes 101 (see FIG. 3A) by the adhesive material.

Furthermore, the auxiliary member 40 may provide (e.g., place or position) the connecting member 200 on top of the anisotropic conductive film that is provided on the pad electrodes 101 (see FIG. 3A) of the display panel 100. According to an embodiment, although the auxiliary member 40 may provide the anisotropic conductive film and the connecting member 200 on the pad electrodes 101 (see FIG. 3A) of the display panel 100, the present disclosure is not limited thereto. The connecting member 200 may be provided by external devices or internal configurations other than the auxiliary member 40.

FIGS. 3A and 3B are views illustrating the configuration of the display panel and the connecting member bonded by the bonding apparatus according to the embodiment of the present disclosure.

Referring to FIGS. 3A and 3B, the display panel 100 according to the embodiment of the present disclosure may include a first substrate 110, a second substrate 120 and a first polarizing layer 130. In an embodiment, the display panel 100 may further include a second polarizing layer 140 (see FIGS. 5A to 7B) positioned on a bottom side of the first substrate 110 (opposite from the side of the first substrate facing the second substrate). A more detailed description thereof will be provided with reference to FIGS. 5A to 7B.

For example, the first substrate 110, the second substrate 120 and the first polarizing layer 130 may each have a shape of a rectangular plate having two pairs of sides that are parallel to each other. For example, each of the first substrate 110, the second substrate 120 and the first polarizing layer 130 may have one pair of sides thereof that are longer than another pair of sides thereof, but the disclosure is not limited thereto. For instance, each of the first substrate 110, the second substrate 120 and the first polarizing layer 130 may be provided in various shapes, such as a closed polygon having a straight side, a circle and/or an ellipse having a curved side, a semi-circle and/or a semi-ellipse having a straight side and a curved side.

The pad electrodes 101 may be formed in a region of the first substrate 110. For example, the pad electrodes 101 may be formed in a region of the first substrate where there is no second substrate 120. The pad electrodes 101 may include a conductive material.

The second substrate 120 may be located on the first substrate 110. For example, an area of the second substrate 120 may be smaller than an area of the first substrate 110.

Furthermore, the first and second substrates 110 and 120 may be flexible substrates, and may each independently be any one of a plastic substrate and a film containing polymeric organic matters having flexible properties.

According to an embodiment, the first and second substrates 110 and 120 may each independently be made of at least one selected from polyimide (PI), polyethylene terephthalate (PET), polyethylene naphthalate (PEN), polycarbonate (PC), polyarylate (PAR), polyetherimide (PEI), polyethersulphone (PES), polyethylene etherphthalate, polyarylate and polyacrylate. However, the first and second substrates 110 and 120 may be made of a plastic film of an organic material or made of various flexible materials, such as a metallic foil and/or thin glass, without being limited to the above-described polymers.

The first polarizing layer 130 may be located above the second substrate 120. For example, an area of the first polarizing layer 130 may be smaller than an area of the second substrate 120.

Herein, for the convenience of description, a region compressed by the bonding unit 10 (e.g., a region where the display panel 100 and the connecting member 200 are overlapped with each other and are bonded to each other) is defined as a bonding region BA, and a distance between the side of the first substrate 110 facing the connecting member 200 and the side of the second substrate 120 facing the connecting member 200 is defined as a bezel distance BD.

Referring to FIG. 3B, the bonding region BA may be a region where a part of the first substrate 110 overlaps a part of the connecting member 200. The pad electrodes 101 and the terminal 201 may be located in the bonding region BA.

While the bezel distance BD may be the distance in the D1-D2 plane between any two respective sides of the first and second substrates 110 and 120, for the convenience of description, only the bezel distance BD between the side of the first substrate 110 facing the connecting member 200 and the side of the second substrate 120 facing the connecting member 200 will be described below.

Technological advances will continue to require a display panel 100 having a small bezel distance BD. As the bezel distance BD decreases, the first polarizing layer 130 moves closer to the bonding region BA, and the thermal deformation or thermal fracture of the first polarizing layer 130 may occur due to the heat transferred from the heating member 16.

The connecting member 200 may include terminals 201. According to an embodiment, an integrated circuit 202 may be mounted on the connecting member 200. However, the present disclosure is not limited thereto.

The connecting member 200 may be attached to the display panel 100. That is, the connecting member 200 may be attached and electrically connected (or coupled) to the first substrate 110 of the display panel 100 via the terminals 201 formed on the side of the connecting member 200.

According to an embodiment, the connecting member 200 may be formed as a film, and may be implemented in a chip on film (COF) along with the integrated circuit (IC) 202. According to an embodiment, the connecting member 200 may be implemented in chip on plastic, tape carrier package and/or the like.

Figure 4:
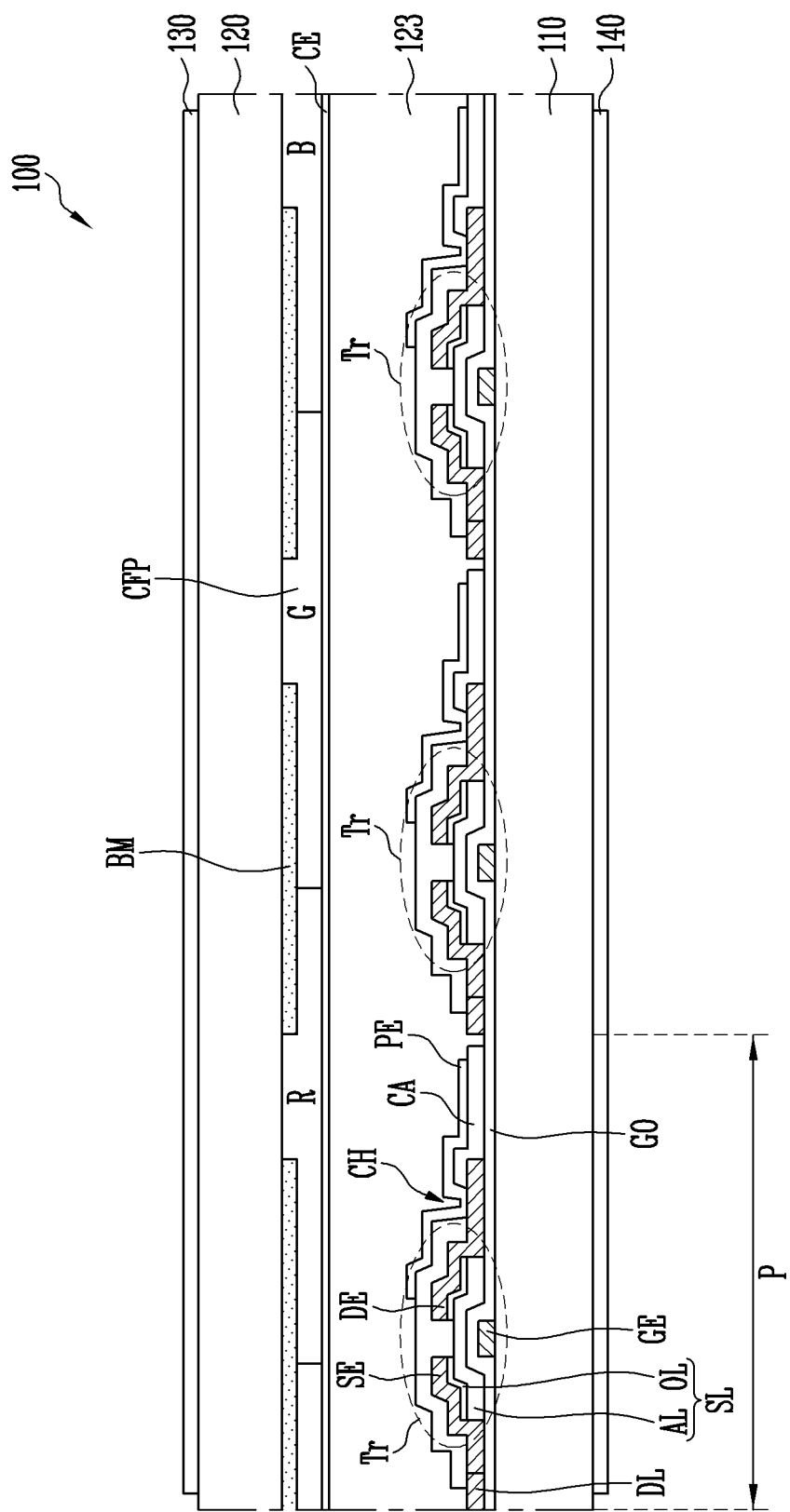
FIG. 4 is a sectional view illustrating a part of the display panel bonded by the bonding apparatus according to an embodiment of the present disclosure.

FIG. 4 is a sectional view illustrating a part of the display panel bonded by the bonding apparatus according to the embodiment of the present disclosure;

FIG. 4 illustrates a section including a pixel P of the display panel 100 implemented in a liquid crystal display panel, for example. However, the present disclosure is not limited thereto.

According to an embodiment, the display panel 100 may be implemented (e.g., utilized) in a liquid crystal display panel, a plasma display panel, a field emission display panel), an organic light emitting diode panel, an electrophoretic display panel and/or the like.

The display panel 100 may form an image using both the optical anisotropy and polarizability of liquid crystals. The liquid crystal is thin and long in molecular structure, and possesses the optical anisotropy having directivity in orientation, and the polarizability changing a molecular orientation direction depending on the intensity of an electric field when the liquid crystal is placed in the electric field.

Referring to FIG. 4, the display panel 100 may include a first substrate 110, a second substrate 120, a liquid crystal layer 123, a first polarizing layer 130, and a second polarizing layer 140.

The first substrate 110 may be located at a lower end of the display panel 100. For example, the first substrate 110 may be a thin film transistor (TFT) panel of the liquid crystal display panel.

According to embodiments, a length of the first substrate 110 may be longer than that of each of the second substrate 120, the first polarizing layer 130 and the second polarizing layer 140. A more detailed description of the first substrate 110 will be provided with reference to FIGS. 5A and 7B.

The liquid crystal layer 123 may be located above the first substrate 110, and the second substrate 120 may be located above the liquid crystal layer 123. For example, the second substrate 120 may be a color filter substrate of the liquid crystal display panel.

After a predetermined (or set) electric field is formed by common voltage and a data signal, between a common electrode CE and a pixel electrode PE of the pixel P selected by a scan signal (or gate signal), the transmittance of light supplied from a backlight may be adjusted depending on the orientation angle of the liquid crystal changed by the electric field, thus displaying an image.

Such a display panel 100 may be implemented in a twisted nematic (TN) mode, a vertical alignment (VA) mode, an in plane switching (IPS) mode, a plane to line switching (IPS) mode and/or the like, according to a method of adjusting the arrangement of the liquid crystal layer 123.

Among them, the IPS mode and the PLS mode are methods in which both the pixel electrode PE and the common electrode CE are disposed on a lower substrate (e.g., the first substrate 110) to adjust the arrangement of the liquid crystal layer by the electric field between the pixel electrode PE and the common electrode CE.

FIG. 4 shows an embodiment in which the common electrode CE is located at (or near) the second substrate 120. However, the display panel 100 according to embodiments of the present disclosure may be utilized even in the IPS mode and/or the PLS mode, where the common electrode CE and the pixel electrode PE are located at (or near) the first substrate 110.

The pixel P may include a transistor Tr, the pixel electrode PE connected to the transistor Tr, and a liquid crystal capacitor formed between the pixel electrode PE and the common electrode CE. Here, the pixel P may further include a storage capacitor.

As illustrated in FIG. 4, the transistor Tr may include a gate electrode GE connected with a scan line (or gate line), source/drain electrodes SE and DE, and a semiconductor layer SL formed between the gate electrode GE and the source/drain electrodes SE and DE. In this regard, the semiconductor layer SL may include an active layer AL and an ohmic contact layer OL.

Furthermore, a gate insulator GO may be formed on the gate electrode GE, and a protective layer CA my be formed on the source/drain electrodes SE and DE. The protective layer CA may have a contact hole CH to expose the drain electrode DE.

Furthermore, the pixel electrode PE may be formed on the protective layer CA, and the pixel electrode PE may be connected (or coupled) with the drain electrode DE via the contact hole CH. Here, the source electrode SE may be connected (or coupled) with a data line DL.

However, the structure of the transistor Tr is not limited to the structure illustrated in FIG. 4.

The liquid crystal capacitor may utilize the pixel electrode PE and the common electrode CE as two terminals. The liquid crystal layer 123 between the pixel electrode PE and the common electrode CE may function as a dielectric.

A grid-shaped black matrix BM may be formed on a rear surface of the second substrate 120 (e.g., the surface of the second substrate 120 facing the first substrate 110) to surround a region of each pixel P and thereby cover a non-display region in which wirings, the transistor Tr and/or the like are present.

Furthermore, a color filter pattern CFP may be present in the black matrix BM to correspond to each pixel P.

In this regard, the color filter pattern CFP may be a color filter pattern CFP having red R, green G and blue B color filters that are repeatedly arranged in this sequence.

In an embodiment, an overcoat layer may be further formed between the color filter pattern CFP and the common electrode CE.

In some embodiments, the positions of the black matrix BM and the color filter pattern CFP may be changed, and the common electrode CE may be formed on an inner surface of the second substrate 120 (e.g., the surface of the second substrate 120 facing the first substrate 110) if the black matrix BM and the color filter pattern CFP are formed at different positions.

In one embodiment, the common electrode CE is formed of a transparent conductive material. However, the common electrode may be formed of other conductive materials such as opaque metal.

For example, the common electrode CE may be formed of indium tin oxide (ITO), indium zinc oxide (IZO), graphene, carbon nanotube, silver nanowires (AgNWs), etc.

Although in the embodiment illustrated in FIG. 4, the common electrode CE is placed on (or near) the second substrate 120, the common electrode CE may be placed on the first substrate 110 instead of the second substrate 120.

The common electrode CE may be formed on the same layer as the pixel electrode PE or a layer different from the pixel electrode PE, depending on the liquid crystal mode.

The first polarizing layer 130 and the second polarizing layer 140 may transmit only light vibrating in the same direction as a polarization axis, in the transmitted light.

The display panel 100 may regulate the intensity of the transmitted light, using the first polarizing layer 130 and the second polarizing layer 140 that can be set to be perpendicular or parallel to each other. Therefore, the display panel 100 may express (e.g., display) a gray color.

According to an embodiment, the first polarizing layer 130 may be located above the second substrate 120 (e.g., on the side of the second substrate 120 facing away from the first substrate 110), and the second polarizing layer 140 may be located under the first substrate 110 (e.g., on the side of the first substrate 110 facing away from the second substrate 120). However, the present disclosure is not limited thereto.

Figure 5A:
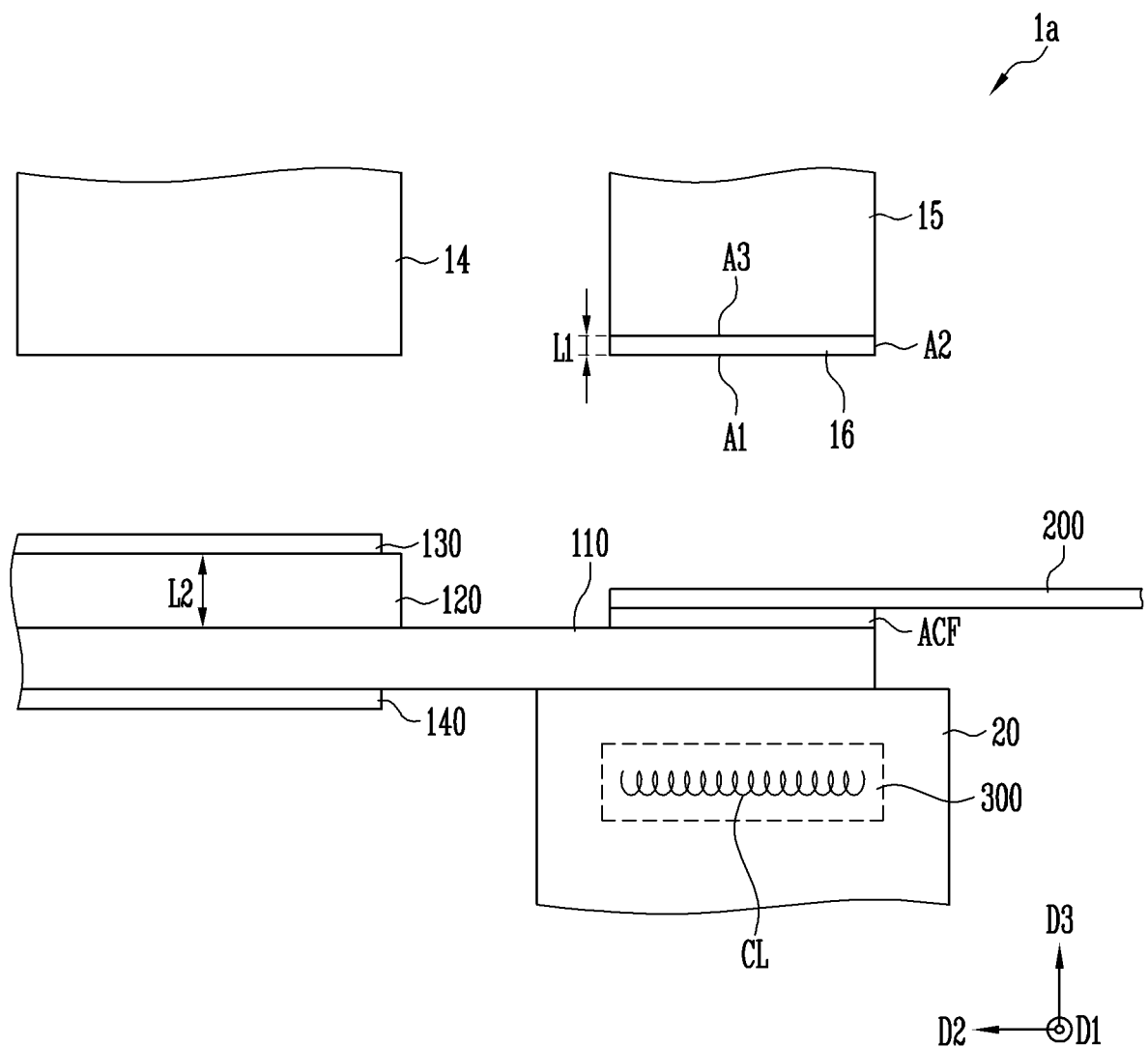
FIGS. 5A and 5B are sectional views illustrating a bonding method of a bonding apparatus according to an embodiment of the present disclosure.
Figure 5B:
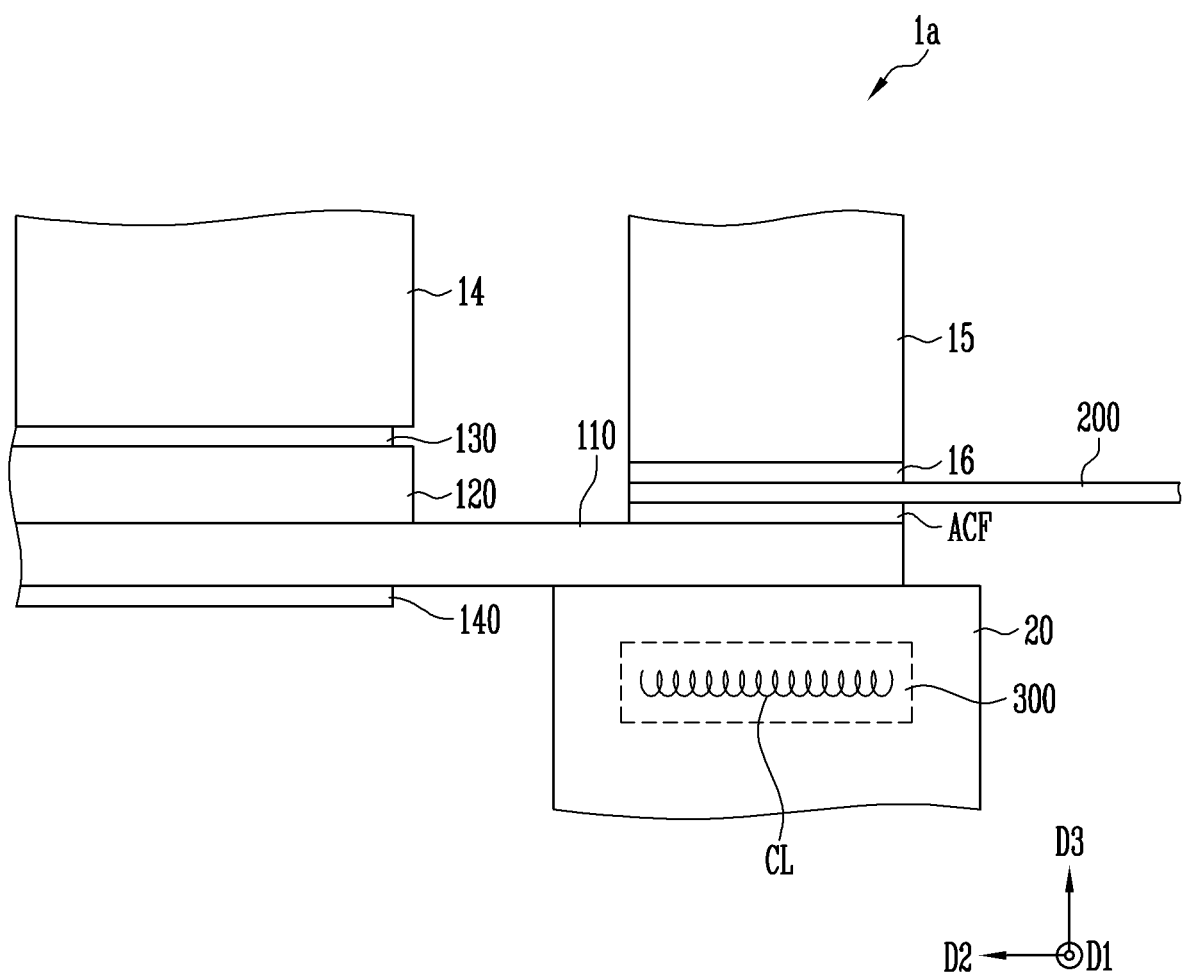

FIGS. 5A and 5B are sectional views illustrating a bonding method of a bonding apparatus according to an embodiment of the present disclosure.

The bonding apparatus 1a shown in FIGS. 5A and 5B further includes a magnetic-field generating part 300, in addition to the components of the bonding apparatus 1 that were described with reference to FIGS. 1 to 4. Thus, the components that are common to the configuration of FIGS. 5A and 5B and that of FIGS. 1 to 4 will carry the same reference numerals, and a duplicated description thereof will not be provided herein.

Components positioned between the first substrate 110 and the second substrate 120 and illustrated in FIG. 4 are not shown in FIGS. 5A and 5B for the convenience of description.

FIGS. 5A and 5B illustrate a state (or act) in which the stage 31 is moved towards the bonding unit 10 and the support member 20 by the moving unit 30 (see FIGS. 1 and 2).

Referring to FIGS. 5A and 5B, the display panel 100 (see FIG. 4) may include a first substrate 110, a second substrate 120, a first polarizing layer 130 and a second polarizing layer 140.

The second substrate 120 may be located above the first substrate 110 (along a third direction axis D3). A horizontal length (e.g., length in the second direction axis D2) of the second substrate 120 may be shorter than a horizontal length (e.g., length in the second direction axis D2) of the first substrate 110.

For example, the first substrate 110 may be a thin film transistor substrate of the liquid crystal display device, and the second substrate 120 may be a color filter substrate of a liquid crystal display device of the display panel 100. However, the present disclosure is not limited thereto.

The first polarizing layer 130 may be located above the second substrate 120 (along the third direction axis D3). A horizontal length (e.g., length in the second direction axis D2) of the first polarizing layer 130 may be shorter than or equal to a horizontal length (e.g., length in the second direction axis D2) of the second substrate 120.

The second polarizing layer 140 may be located under the first substrate 110 (along the third direction axis D3). A horizontal length (e.g., length in the second direction axis D2) of the second polarizing layer 140 may be shorter than the horizontal length (e.g., length in the second direction axis D2) of the first substrate 110, and may be equal to the horizontal length (e.g., length in the second direction axis D2) of the first polarizing layer 130.

The press member 14 may be located above the first polarizing layer 130 (along the third direction axis D3). When the bonding unit 10 (see FIG. 2) performs a bonding operation along the third direction axis D3, the press member 14 may move along the third direction axis D3. Therefore, the press member 14 may compress a top surface of the first polarizing layer 130. Thereby, the display panel 100 may be easily fixed.

The bonding head 15 may be located above the support member 20 (along the third direction axis D3). When the bonding unit 10 (see FIG. 2) performs the bonding operation along the third direction axis D3, the bonding head 15 may move along the third direction axis D3. Therefore, the bonding head 15 may compress a top surface of the connecting member 200 via the heating member 16. The bonding head 15 may have heat resistance, and may block heat transfer from the heating member 16.

The heating member 16 may be attached to a bottom of the bonding head 15.

According to an embodiment, the heating member 16 may be attached to a surface of the bonding head 15 facing the support member 20. However, the present disclosure is not limited thereto.

The heating member 16 may have the shape of a plate including a first surface A1 that comes into contact with the connecting member 200, a second surface A2 that surrounds a circumference of the first surface A1, and a third surface A3 that is attached to the bonding head 15 and is opposite the first surface A1.

The first surface A1 and the third surface A3 may have various shapes, including a closed polygon having a straight side, a circle and/or an ellipse having a curved side, a semi-circle and/or a semi-ellipse having a straight side and a curved side.

A thickness L1 of the heating member 16 may be smaller than a thickness L2 of the second substrate 120 of the display panel 100. According to an embodiment, as illustrated in FIG. 5B, when the bonding head 15 compresses the top surface of the connecting member 200 via the heating member 16, the thickness L1 of the heating member 16 may be such that the top surface of the heating member 16 is lower than the top surface of the second substrate 120. In this case, heat transfer from the heating member 16 to the first polarizing layer 130 may be minimized or reduced. Therefore, it may be possible to prevent or reduce the thermal deformation and/or thermal fracture of the first polarizing layer 130.

The heating member 16 may be heated by an electromagnetic induction method, utilizing a magnetic field generated by the magnetic-field generating part 300.

The heating member 16 may transfer heat through the first surface A1 and the second surface A2. For example, the heating member 16 may transfer heat through radiation, convection and/or conduction.

The heating member 16 may transfer heat to the first substrate 110 of the display panel 100, the anisotropic conductive film ACF and the connecting member 200. Furthermore, the heating member 16 may transfer heat to the second substrate 120 and/or the first polarizing layer 130 through radiation and/or convection.

The support member 20 may be located under the bonding head 15 (along the third direction axis D3).

The support member 20 may support a part of the first substrate 110 and the connecting member 200. In an embodiment, the support member 20 may be in contact with the bottom of the first substrate 110.

As illustrated in FIGS. 5A and 5B, the anisotropic conductive film ACF may be interposed between the first substrate 110 and the connecting member 200.

As the bonding process is performed, the conductive particles contained in the anisotropic conductive film ACF are bonded to the pad electrodes 101 on the first substrate 110 (see FIG. 3A) and the terminals 201 on the connecting member 200 (see FIG. 3A), so that the display panel 100 and the connecting member 200 may be electrically connected (or coupled) to each other.

The support member 20 may include the magnetic-field generating part 300.

The magnetic-field generating part 300 may generate a magnetic field to heat the heating member 16 by an electromagnetic induction method.

According to an embodiment, the magnetic-field generating part 300 may include a coil CL, and may be operated by alternating current power. However, the present disclosure is not limited thereto.

Figure 6A:
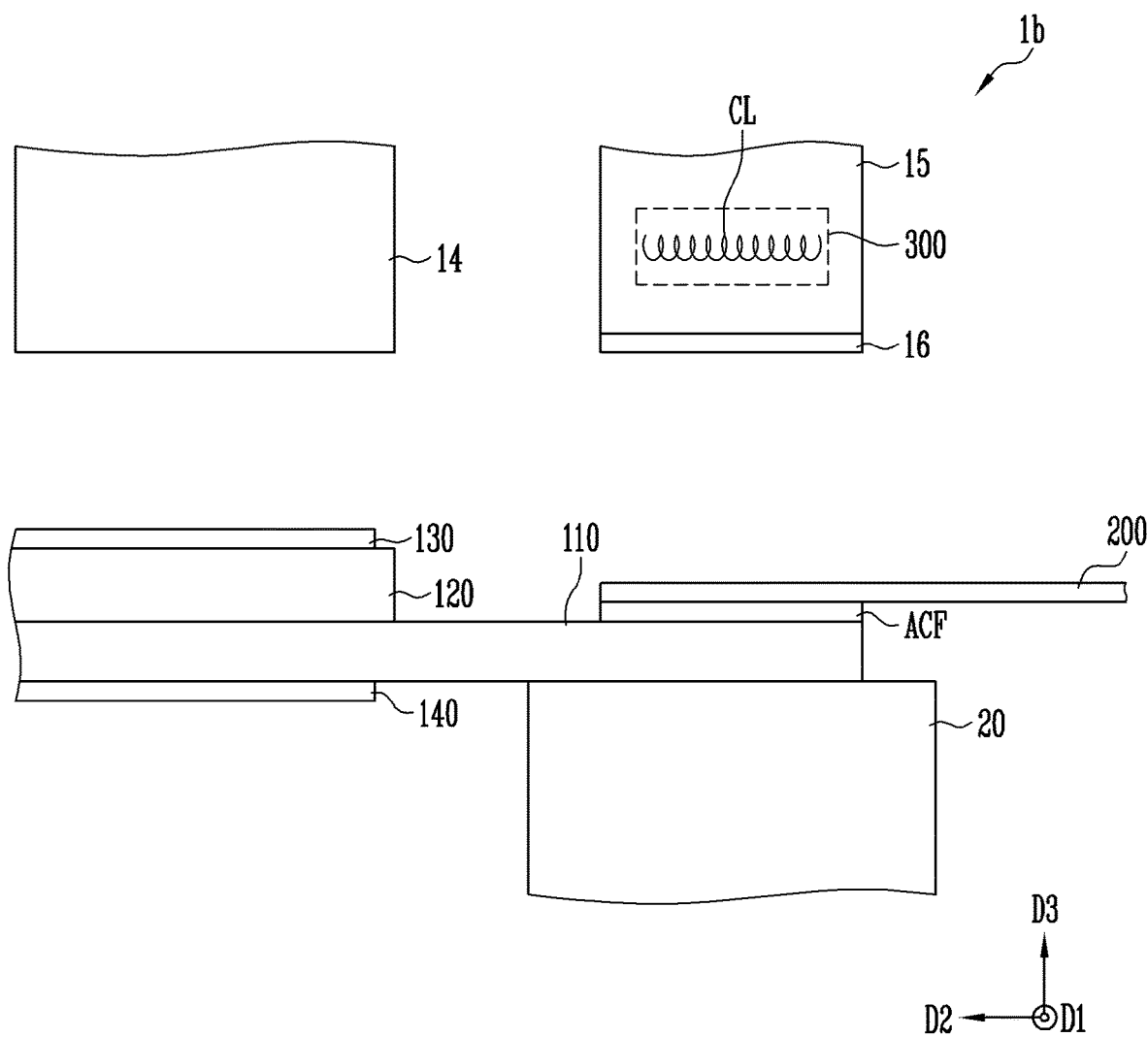
FIGS. 6A and 6B are sectional views illustrating a bonding method of a bonding apparatus according to an embodiment of the present disclosure.
Figure 6B:
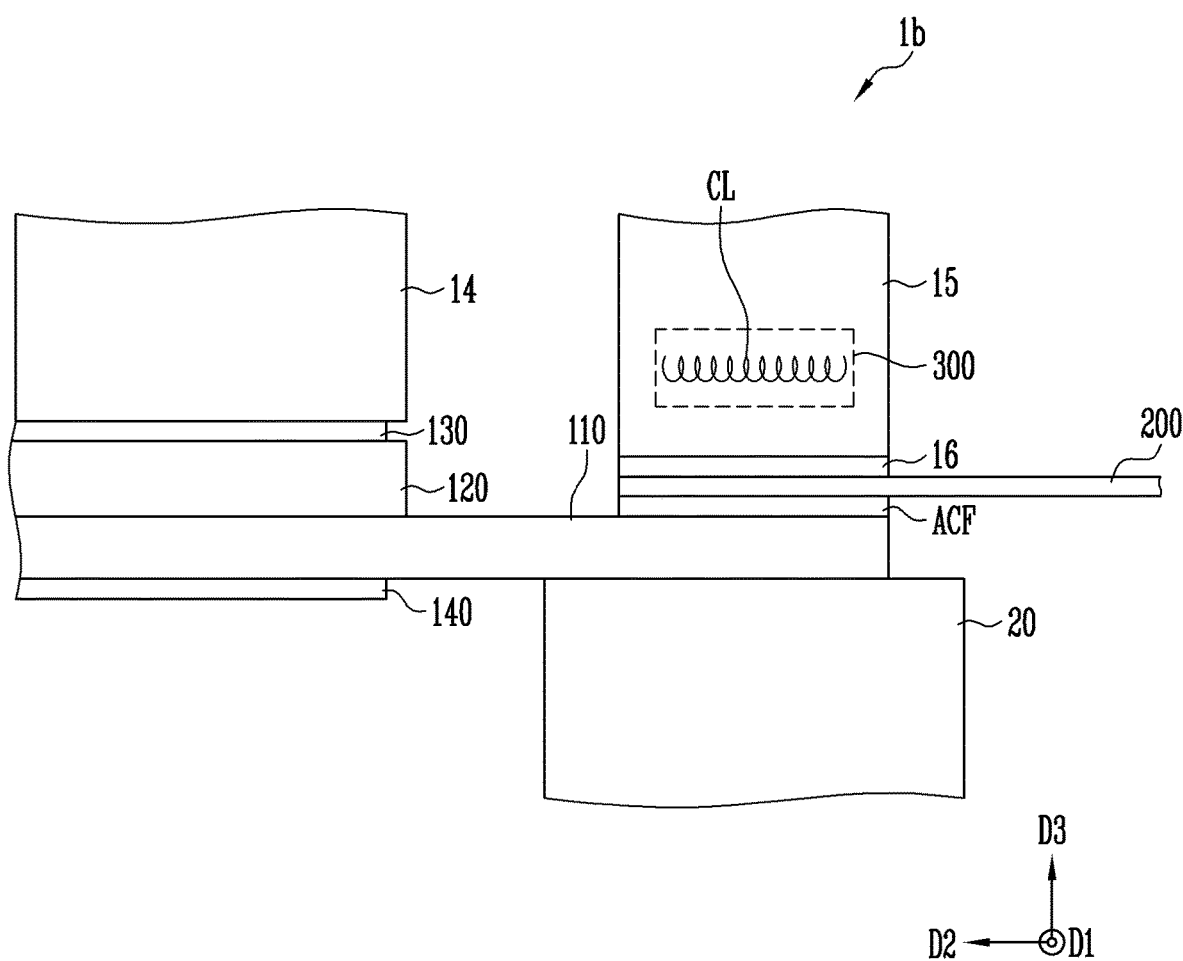

FIGS. 6A and 6B are sectional views illustrating a bonding method of a bonding apparatus according to an embodiment of the present disclosure.

The bonding apparatus 1b shown in FIGS. 6A and 6B further includes a magnetic-field generating part 300, in addition to the components of the bonding apparatus 1 that is described with reference to FIGS. 1 to 4. Thus, the components that are common to the configuration of FIGS. 6A and 6B and that of FIGS. 1 to 4 will carry the same reference numerals, and a duplicated description thereof will not be provided herein.

Components positioned between the first substrate 110 and the second substrate 120 as illustrated in FIG. 4 are not shown in FIGS. 6A and 6B for the convenience of description.

FIGS. 6A and 6B illustrate a state (or act) in which the stage 31 is moved towards the bonding unit 10 and the support member 20 by the moving unit 30 (see FIGS. 1 and 2).

In this embodiment, the bonding head 15 may include the magnetic-field generating part 300.

The magnetic-field generating part 300 may generate a magnetic field to heat the heating member 16 by an electromagnetic induction method.

According to an embodiment, the magnetic-field generating part 300 may include a coil CL, and may be operated by alternating current power. However, the present disclosure is not limited thereto.

The heating member 16 may be attached to a bottom of the bonding head 15. In this case, a distance between the heating member 16 and the magnetic-field generating part 300 may be kept constant as the bonding head 15 moves along the third direction axis D3. Thus, the magnetic-field generating part 300 may provide a magnetic field of a constant intensity to the heating member 16, regardless of the movement of the bonding head 15 along the third direction axis D3.

The thickness L1 of the heating member 16 may be smaller than the thickness L2 of the second substrate 120 of the display panel 100. According to an embodiment, as illustrated in FIG. 6B, when the bonding head 15 compresses the top surface of the connecting member 200 via the heating member 16, the thickness L1 of the heating member 16 may be such that the top surface of the heating member 16 is lower than the top surface of the second substrate 120. In this case, the heating member 16 may minimize or reduce the transfer of heat to the first polarizing layer 130. Therefore, it may be possible to prevent or reduce the thermal deformation and/or thermal fracture of the first polarizing layer 130.

The heating member 16 may be heated by the electromagnetic induction method, utilizing the magnetic field generated by the magnetic-field generating part 300. According to an embodiment, the heating member 16 may be heated by the electromagnetic induction method, even when the bonding head 15 does not compress the top surface of the connecting member 200. In this case, the heating member 16 may be preheated before the bonding head 15 is compressed. However, the present disclosure is not limited thereto.

Figure 7B:
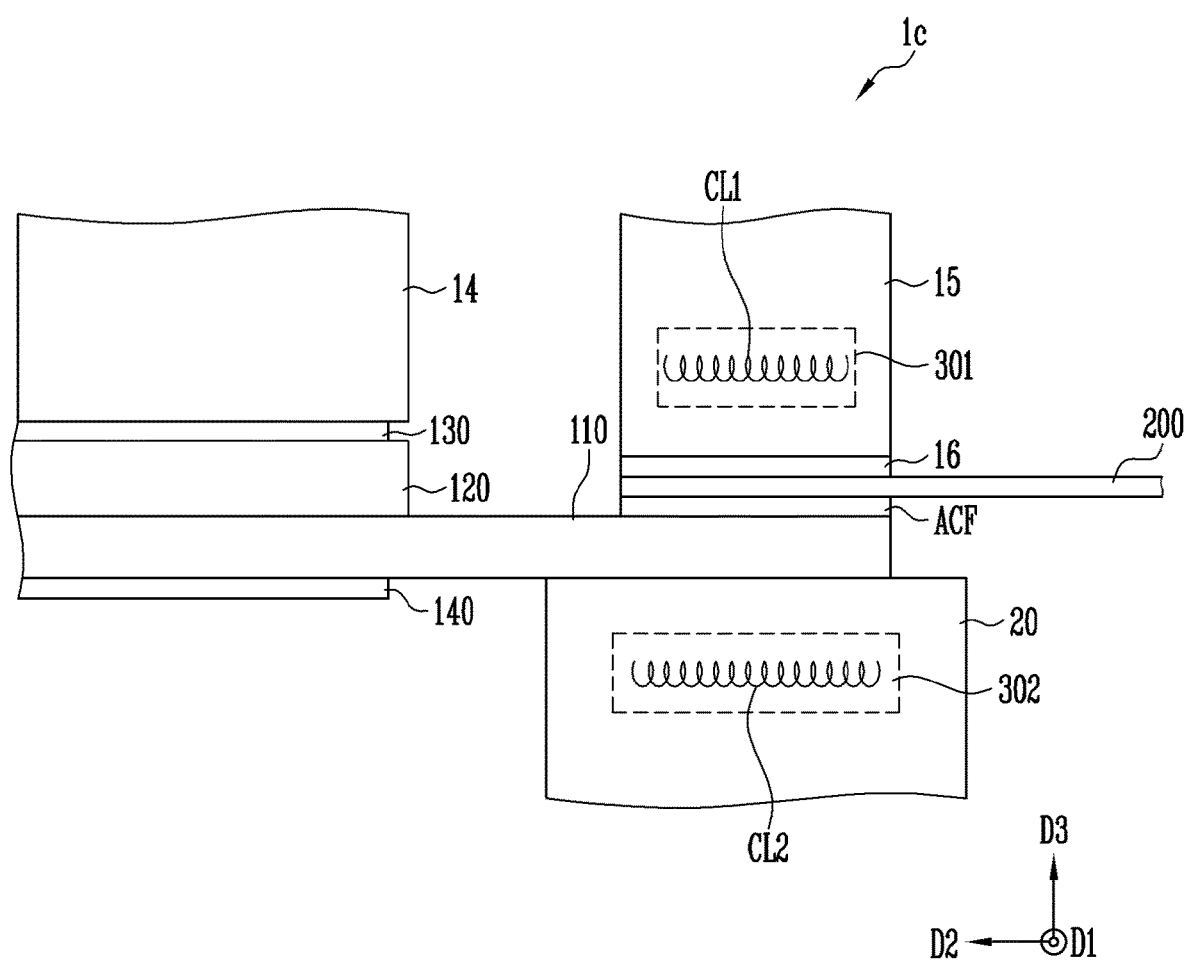

FIGS. 7A and 7B are sectional views illustrating a bonding method of a bonding apparatus according to an embodiment of the present disclosure.

The bonding apparatus 1c shown in FIGS. 7A and 7B further includes a first magnetic-field generating part 301 and a second magnetic-field generating part 302, in addition to the components of the bonding apparatus 1 that is described with reference to FIGS. 1 to 4. Thus, the components that are common to the configuration of FIGS. 7A and 7B and that of FIGS. 1 to 4 will carry the same reference numerals, and a duplicated description thereof will not be provided herein.

Components positioned between the first substrate 110 and the second substrate 120 as illustrated in FIG. 4 are not shown in FIGS. 7A and 7B for the convenience of description.

FIGS. 7A and 7B illustrate a state (or act) in which the stage 31 is moved towards the bonding unit 10 and the support member 20 by the moving unit 30 (see FIGS. 1 and 2).

The bonding head 15 may include the first magnetic-field generating part 301, and the support member 20 may include the second magnetic-field generating part 302.

Each of the first magnetic-field generating part 301 and the second magnetic-field generating part 302 may generate a magnetic field to heat the heating member 16 by the electromagnetic induction method.

According to an embodiment, the first magnetic-field generating part 301 and the second magnetic-field generating part 302 may include a first coil CL1 and a second coil CL2, respectively, and may be operated by alternating current power. However, the present disclosure is not limited thereto.

The heating member 16 may be attached to a bottom of the bonding head 15. In this case, a distance between the heating member 16 and the first magnetic-field generating part 301 may be kept constant (e.g., as the bonding head 15 moves along the third direction axis D3).

The heating member 16 may be heated by the electromagnetic induction method, utilizing a magnetic field generated by the first magnetic-field generating part 301 and a magnetic field generated by the second magnetic-field generating part 302.

The first magnetic-field generating part 301 may provide a magnetic field of a constant intensity to the heating member 16, regardless of the movement of the bonding head 15 along the third direction axis D3.

The thickness L1 of the heating member 16 may be smaller than the thickness L2 of the second substrate 120 of the display panel 100. According to an embodiment, as illustrated in FIG. 7B, when the bonding head 15 compresses the top surface of the connecting member 200, the thickness L1 of the heating member 16 may be such that the top surface of the heating member 16 is lower than the top surface of the second substrate 120. In this case, the heating member 16 may minimize or reduce the transfer of heat to the first polarizing layer 130. Therefore, it may be possible to prevent or reduce the thermal deformation and/or thermal fracture of the first polarizing layer 130.

According to an embodiment, the heating member 16 may be heated by the electromagnetic induction method, even when the bonding head 15 does not compress the top surface of the connecting member 200. In this case, the heating member 16 may be preheated before the bonding head 15 is compressed.

FIG. 8 is a flowchart illustrating acts of an operation of the bonding apparatus according to the embodiment of the present disclosure.

Referring to FIGS. 1 to 8, the bonding apparatus 1 according to the embodiment of the present disclosure may provide the first substrate 110 on the stage 31 (S10).

The bonding apparatus 1 may provide the anisotropic conductive film ACF on the pad electrodes 101 of the first substrate 110 (S20).

The bonding apparatus 1 may provide the connecting member 200 on the anisotropic conductive film ACF (S30).

The bonding apparatus 1 may generate a magnetic field, and may heat the heating member 16 through the magnetic field (S40).

The bonding apparatus 1 may bond the first substrate 110 and the connecting member 200, using the bonding head 15 to which the heating member 16 is attached (S50).

The bonding apparatus and the bonding method thereof according to an embodiment of the present disclosure may prevent or reduce thermal deformation and/or thermal fracture of a polarizing layer when a bonding process is performed, by reducing the amount of heat that is transferred to the polarizing layer included in a display panel.

The bonding apparatus and the bonding method thereof according to an embodiment of the present disclosure may increase thermal efficiency of the bonding apparatus and reduce power consumption.

Furthermore, the bonding apparatus and the bonding method thereof according to an embodiment of the present disclosure may reduce preheating time of the bonding apparatus.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Example embodiments have been disclosed herein. While the present invention has been described with respect to the specific embodiments, it will be apparent to those skilled in the art that various changes and modifications may be made without departing from the spirit and scope of the present invention as defined in the following claims and equivalents thereof.

What is claimed is:

1. A bonding apparatus comprising:
a support member configured to support a first substrate of a display panel and a connecting member;
a bonding unit above the support member, and configured to compress the first substrate and the connecting member against each other using a bonding head to which a heating member is attached; and
a magnetic-field generating part configured to generate a magnetic field to heat the heating member by an electromagnetic induction method,
wherein the heating member comprises a first surface facing the connecting member, a third surface attached to the bonding head, and a second surface surrounding a circumference of the first surface and the third surface,
wherein the heating member is configured to transfer heat through the first surface and the second surface,
wherein the bonding head is a heat resistor configured to block the heat transferred from the heating member,
wherein a second substrate of the display panel is on the first substrate, and
when the bonding unit compresses a top surface of the connecting member, the third surface of the heating member is lower than a top surface of the second substrate.

2. The bonding apparatus according to claim 1, wherein the support member comprises the magnetic-field generating part.

3. The bonding apparatus according to claim 2, wherein the magnetic-field generating part comprises a plurality of coils, and is configured to operate by alternating current power.

4. The bonding apparatus according to claim 1, wherein the heating member comprises at least one selected from iron, cast iron, and ferromagnetic stainless steel.

5. The bonding apparatus according to claim 1, wherein the first substrate comprises a plurality of pad electrodes and the connecting member comprises a plurality of terminals, and
wherein the bonding unit is configured to compress the plurality of pad electrodes of the first substrate and the plurality of terminals of the connecting member against each other.

6. The bonding apparatus according to claim 1, wherein at least one of the display panel and the connecting member has flexibility.

7. The bonding apparatus according to claim 1, wherein a thickness of the heating member is smaller than a thickness of the second substrate.

8. A bonding apparatus comprising:
a moving unit configured to move a first substrate of a display panel;
a support member configured to support the first substrate and a connecting member;
a second substrate of the display panel on the first substrate;
a bonding unit above the support member, and configured to compress the first substrate and the connecting member against each other using a bonding head equipped with a heating member; and
a first magnetic-field generating part and a second magnetic-field generating part, each configured to generate a magnetic field to heat the heating member by an electromagnetic induction method,
wherein the heating member comprises a first surface facing the connecting member, a third surface attached to the bonding head, and a second surface surrounding a circumference of the first surface and the third surface, wherein the heating member is configured to transfer heat through the first surface and the second surface, wherein the bonding head is a heat resistor configured to block the heat transferred from the heating member, and wherein when the bonding unit compresses a top surface of the connecting member, the third surface of the heating member is lower than a top surface of the second substrate.

9. The bonding apparatus according to claim 8, wherein the bonding unit comprises the first magnetic-field generating part.

10. The bonding apparatus according to claim 9, wherein the support member comprises the second magnetic-field generating part.

11. The bonding apparatus according to claim 10, wherein each of the first magnetic-field generating part and the second magnetic-field generating part comprises a plurality of coils, and is configured to operate by alternating current power.

12. An operating method of a bonding apparatus, the method comprising:

providing an anisotropic conductive film on a pad electrode of a first substrate with a second substrate disposed thereon;

providing a connecting member on the anisotropic conductive film;

generating a magnetic field, and heating a heating member through the magnetic field; and bonding the first substrate and the connecting member to each other, using a bonding head equipped with the heating member, wherein the heating member comprises a first surface facing the connecting member, a third surface attached to the bonding head, and a second surface surrounding a circumference of the first surface and the third surface, wherein the heating member is configured to transfer heat through the first surface and the second surface, wherein the bonding head is a heat resistor configured to block the heat transferred from the heating member, and wherein when the first substrate and the connecting member are bonded to each other, the third surface of the heating member is lower than a top surface of the second substrate.

* * * * *